United States Patent [19]

Brodsky et al.

[11] Patent Number: 5,197,888

[45] Date of Patent: Mar. 30, 1993

[54] METHOD OF POSITIONING FLEXIBLE CIRCUIT MEMBERS ON A COMMON CIRCUIT MEMBER

[75] Inventors: William L. Brodsky, Binghamton; Donald P. Seraphim, Vestal, both of N.Y.

[73] Assignee: International Business Machines Corporation, Armonk, N.Y.

[21] Appl. No.: 841,120

[22] Filed: Feb. 25, 1992

[51] Int. Cl.⁵ .............................................. H01R 9/09
[52] U.S. Cl. ...................................... 439/67; 439/378
[58] Field of Search ................... 439/67, 77, 374, 378, 439/380, 381, 680, 681; 29/592.1

[56] References Cited

U.S. PATENT DOCUMENTS

| | | | |
|---|---|---|---|
| 4,087,146 | 5/1978 | Hudson | 439/67 |
| 4,693,529 | 9/1987 | Stillie | 439/493 |
| 4,744,764 | 5/1988 | Rubenstein | 439/62 |
| 4,898,538 | 2/1990 | Tratar et al. | 439/378 |
| 4,907,975 | 3/1990 | Dranchak et al. | 439/67 |
| 4,925,400 | 5/1990 | Blair et al. | 439/374 |
| 4,975,068 | 12/1990 | Squires | 439/67 |
| 5,009,605 | 4/1991 | Crumly et al. | 439/67 |
| 5,009,607 | 4/1991 | Gordon et al. | 439/67 |
| 5,032,088 | 7/1991 | Kuramitsu | 439/378 |
| 5,059,129 | 10/1991 | Brodsky et al. | 439/67 |

Primary Examiner—Neil Abrams
Attorney, Agent, or Firm—Lawrence R. Fraley

[57] ABSTRACT

A method for providing precise alignment and positioning of a plurality of flexible circuit members on a common, rigid circuit member. The steps of the method include providing reference points on a support member (e.g., metal frame) which forms part of the common circuit member, accurately determining the precise location of the several contact arrays on the common circuit member's substrate, and providing location apertures from these measurements within the support member to accept precisely located male pins which form part of the flexible circuit members.

18 Claims, 5 Drawing Sheets

METHOD OF POSITIONING FLEXIBLE CIRCUIT MEMBERS ON A COMMON CIRCUIT MEMBER

TECHNICAL FIELD

The invention relates to electrical connector assemblies and more particularly to such assemblies wherein a plurality of flexible circuit members are electrically connected to a larger, common circuit member (e.g., printed circuit board or circuitized ceramic substrate). Even more particularly, the invention relates to such assemblies adapted for utilization within information handling systems (computers).

BACKGROUND OF THE INVENTION

Various electrical connector assemblies, including those for coupling flexible circuitized substrates with common circuit members, including within the computer field, are known. Various examples of connector assemblies for coupling flexible and common circuit members are shown and described in U.S. Pat. Nos. 4,087,146 (Hudson, Jr.), 5,009,605 (Crumly et al), 5,009,607 (Gordon et al), 4,693,529 (Stillie), 4,744,764 (Rubenstein), 4,907,975 (Dranchak et al) and 5,059,129 (Brodsky et al).

The present invention, as defined herein, comprises a connector assembly wherein several (e.g., seven or eight) individual, flexible circuit members may be aligned with and electrically coupled to a rigid, common circuit member in a highly precise manner. Most significantly, the invention as defined is able to provide such alignment and coupling for circuit members having high density arrays of contact elements (e.g., pads) as part thereof. By the term high density as used herein is meant the provision of electrical connections between arrays of conductive elements (e.g., copper pads) having a density greater than about two hundred individual contact elements per square inch. Although the invention as described herein illustrates the connection of arrays of individual conductor pads (e.g., those of rectangular configuration), it is understood that the invention is not so limited. For example, the invention is able to provide precise electrical coupling between flexible and common circuit members having arrays composed at least in part of several individual lines (paths). Accordingly, the term high density as used herein is also meant to include those lined arrays having from about twenty to about thirty-five or more individual circuit lines per linear inch, such circuit lines typically having a width of only from about 0.025 mm to about 0.127 mm. As can be appreciated, effective electrical coupling between such relatively large numbers of elements per individual circuit member assures miniaturization of such structures as is highly desired in the computer industry. As will be further defined herein, the invention provides such connections in a relatively effective manner while substantially preventing damage to the relatively flexible circuit members. Further, the invention as defined lends itself to mass production techniques, thus being able to appreciate the advantages thereof. Most significantly, however, the invention is capable of providing highly precise connections on a repeatable basis and in a relatively easy manner. By the term precise as used herein is meant to define tolerance deviations of no greater than from about 0.003 mm to about 0.130 mm between the original contact pad array (line of center) on each individual flexible circuit and the eventual contact pad array (line of center) on the common circuit member mating with same.

The several aforementioned connector arrangements for coupling flexible circuit members and respective circuit boards or the like, while satisfactory for the purposes described, are not considered capable of providing the highly precise type of alignment and coupling taught herein.

It is believed that a method of coupling flexible circuit members with a common circuit member possessing the several advantageous features described above and otherwise discernible from the teachings herein would constitute a significant advancement in the art.

DISCLOSURE OF THE INVENTION

It is, therefore, a primary object of the invention to enhance the art of electrical connector assemblies by providing a method of individually aligning and coupling a plurality of flexible circuit members to a common circuit member in a highly precise manner.

It is another object of the invention to provide such a method which can be accomplished in a relatively easy manner while still assuring such effective connection where desired.

It is yet another object of the invention to provide such a method wherein interchangeability (of the flexible circuit members) is possible, as well as individual replacement thereof, while assuring precise alignment with the invention's common circuit member.

In accordance with one aspect of the invention, there is provided a method of precisely positioning a plurality of flexible circuit members each having at least one contact array thereon on a rigid, common circuit member having a plurality of contact arrays such that each of the contact arrays of the flexible circuit members align with and engage a respective contact array on the common circuit member. The method comprises the steps of providing a plurality of flexible circuit members each of which include a flexible circuitized substrate with the aforedefined contact array thereon and a holder member having at least two locating elements which are precisely oriented with respect to the individual contact array, providing a rigid, common circuit member having a plurality of contact arrays thereon, establishing first and second reference points, determining from these reference points the precise location of each of the common circuit member's contact arrays, providing a pair of location apertures within the common circuit member relative to each of the common circuit member's contact arrays based on the precise dimensions of the flexible circuit contact arrays with respect to the locating elements on the respective holder member, and then positioning these locating elements within the respective pairs of location apertures to thus align the flexible circuit members and contact arrays of the common circuit member in a precise manner.

In accordance with another aspect of the invention, there is provided a method of precisely positioning a plurality of flexible circuit members each having a contact array thereon on a rigid common circuit member having a plurality of contact arrays such that each of the flexible circuit member's contact arrays align with and engage a respective array of the common circuit member. The method comprises the steps of providing a plurality of flexible circuit members each having the aforementioned flexible circuitized substrate and holder member with two locating elements, providing the defined common circuit member, establishing first and second reference points, determining from these reference points the location of the common circuit member's contact arrays, determining the location of a pair of location apertures within a common circuit member relative to each of the common circuit member's individual contact arrays, providing these location apertures within a pair of alignment members such that a first of these apertures is located within one alignment member and a second of the pair of location apertures is located within the second alignment member, positioning the alignment members on the common circuit member such that the first alignment member is positioned relative to the first and third reference points and the second alignment member is positioned relative to the second and fourth reference points, and thereafter positioning the locating elements of the flexible circuit members within the described location apertures within the first and second alignment members to thereby align these flexible circuit members with the rigid, common circuit member.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
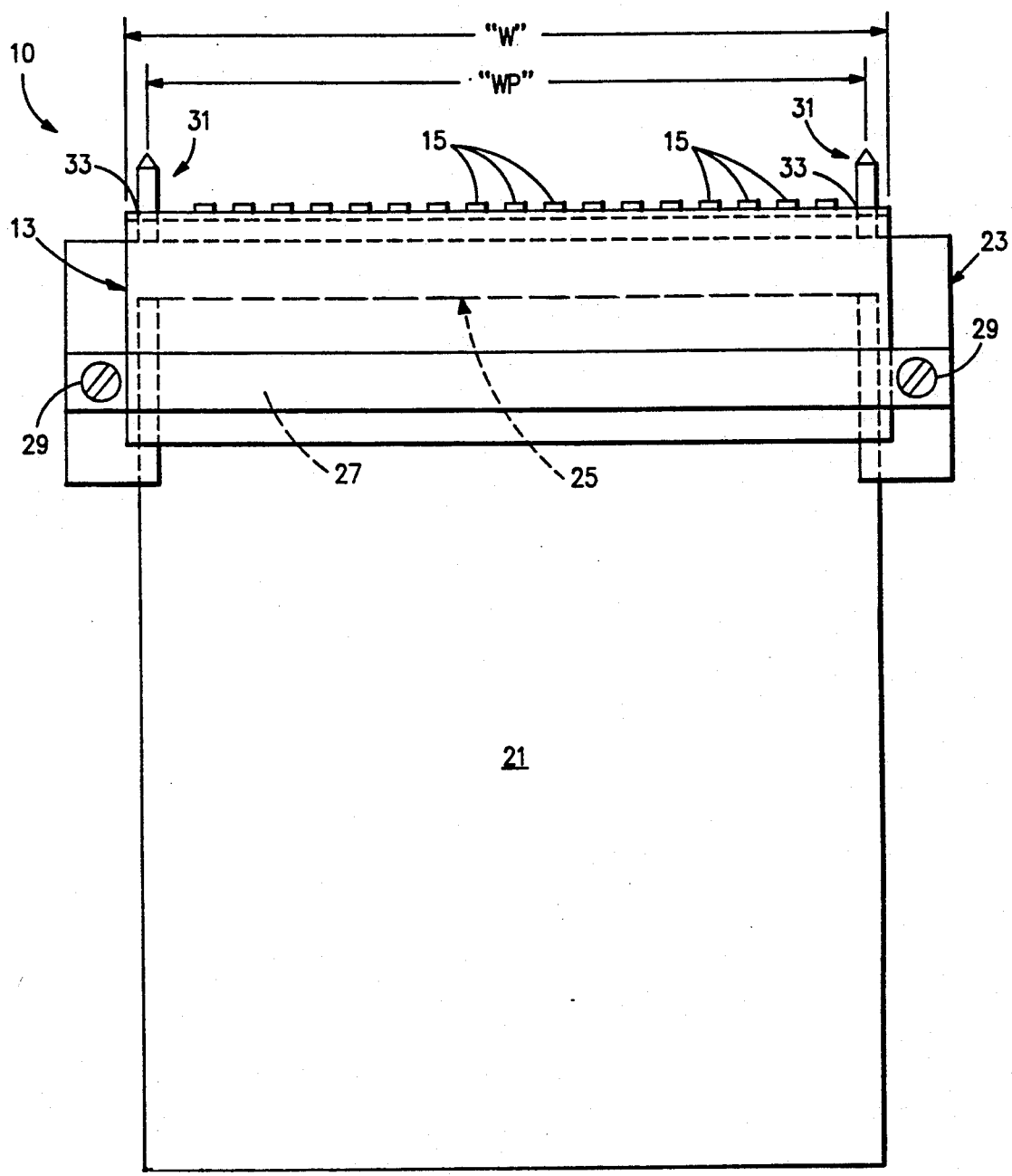
FIG. 1 is a top plan view of a flexible circuit member in accordance with one embodiment of the invention.
Figure 2:
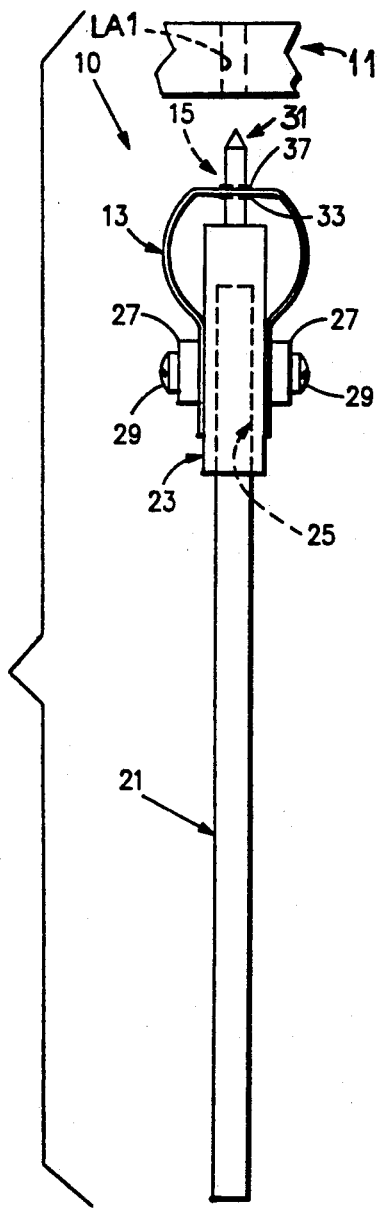
FIG. 2 is a side elevational view of the flexible circuit member of FIG. 1.
Figure 3:
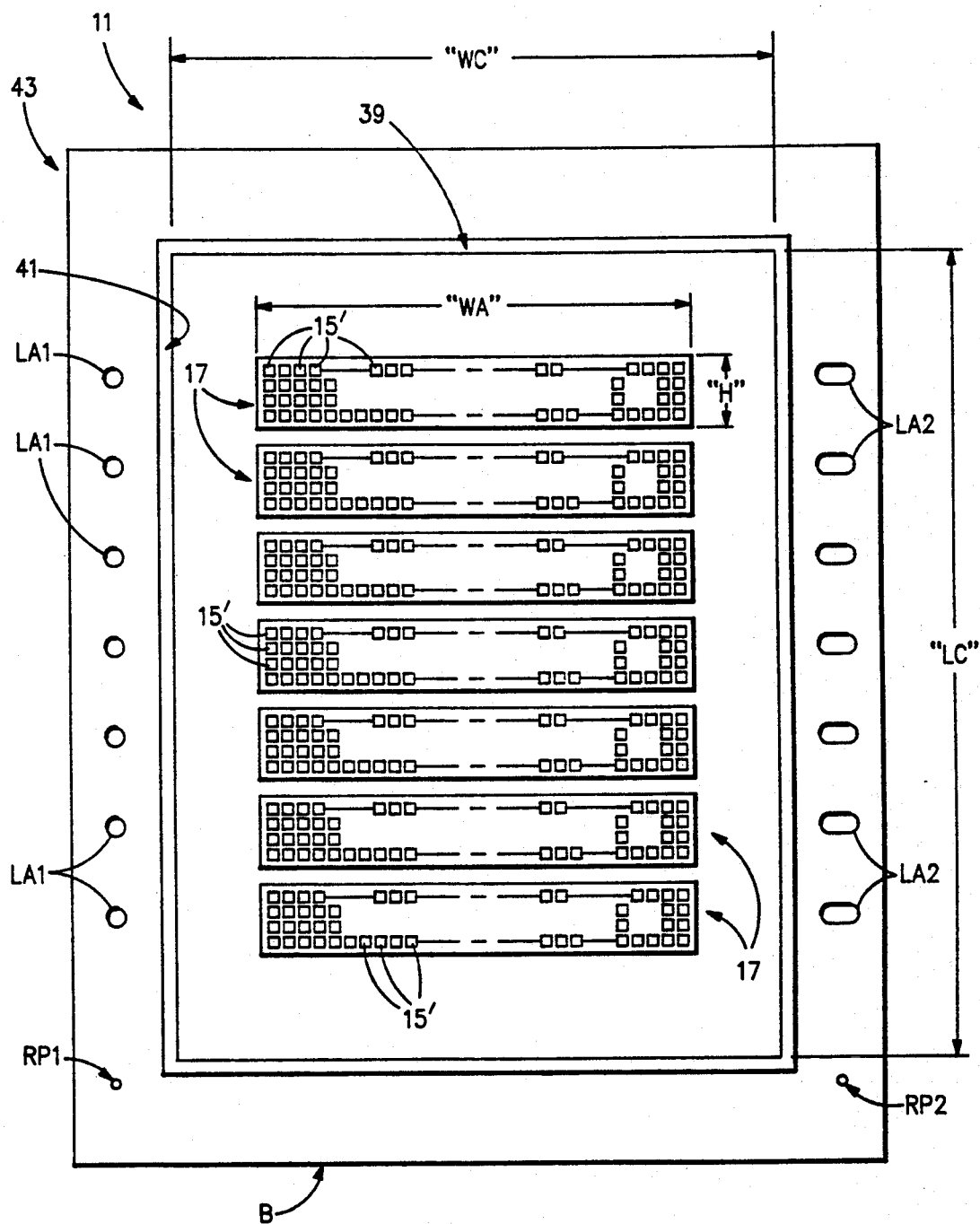
FIG. 3 is a front elevational view, on a reduced scale over the embodiment shown in FIG. 1, of a rigid, common circuit member in accordance with one embodiment of the invention.

In FIGS. 1 and 2, there is shown an example of a flexible circuit member 10 which can be aligned with and positioned on a common circuit member 11 (FIG. 3) in accordance with the method of the present invention. Flexible circuit member 10, as shown, is understood to comprise one of several such members capable of being successfully positioned on common circuit member 11. Member 10, as shown in FIGS. 1 and 2, includes a flexible circuitized substrate 13 which, as shown, includes a plurality of electrical contact elements (e.g., pads) 15 located in an established array on one surface of the substrate. In a preferred embodiment, flexible substrate 13 possesses an overall length of about 165 mm and a width (dimension "W" in FIG. 1) of about 160 mm. Substrate 13 includes a dielectric layer of polyimide or other suitable polymer material having a thickness of only about 0.05 mm. The array of contact elements is preferably of substantially rectangular configuration, similar in overall area to that shown for the several arrays 17 shown on common circuit member 11 in FIG. 3. In a preferred embodiment, this rectangular array of contact elements 15 (e.g., copper pads) possesses an overall length of about 140 mm and a width of about 10 mm, and includes a total of 3,000 contact elements as part thereof. In this embodiment, it is thus seen that the invention is able to connect arrays having a density of about 1400 elements per square inch. Each element on the flexible circuit is preferably semi-spherical having a diameter of 0.1 mm. Each element on the invention's only common circuit member (described below) is rectangular (similar to those in arrays 17), having length and width dimensions of 0.15 mm and 0.46 mm, respectively. Each such element 15 also possesses a thickness of about 0.01 mm. The defined array dimensions, understandably, are similar to those for each of the arrays 17 found on circuit member 11 represented by the dimensions "WA" and "H", respectively (FIG. 3). In addition to several contact pads, the surface(s) of the dielectric substrate for flexible circuit member 10 may also include additional circuitry (e.g., chromium-copper), not shown, to provide desired circuit connections to selected ones of the contact pads 15. In the particular embodiment shown in FIGS. 1 and 2, such additional circuitry is utilized to couple the array on substrate 13 with a third circuit member 21, which circuit member 21 is preferably a printed circuit board or, alternatively, may be a circuitized ceramic substrate. Such a circuit board may be produced from known materials (e.g., epoxy resin, glass-ceramic or alumina dielectric, chromium-copper circuitry, etc.) utilizing techniques known in the art, and further description is thus not believed necessary. Significantly, third circuit member 21 is retained within a holder member 23 which also forms part of flexible circuit member 10. Holder 23 is preferably a plastic housing having an elongated slot 25 therein designed to accommodate an edge portion of board 21. Appropriate connections between the circuitry on substrate 13 and respective circuitry (not shown) on board 21 is provided by aligning the flexible circuit's circuitry with the board's circuitry and then locking these mated surfaces in position, for example, using a pair of common bars (beams) 27. Such bars 27 are secured to the plastic holder 23 using, for example, screws 29. In this arrangement, it is thus seen that the non-compressed portion of the flexible circuit 10 provides a bulbous configuration extending about the upper edge portion of holder 23. In a preferred embodiment, holder 23 is comprised of a suitable plastic, with acceptable examples being polycarbonate, phenolic, and polyphenylene sulfide. The clamping bars 27 are preferably metallic, with one preferred material being stainless steel.

In the embodiment of flexible circuit member 10 as shown in FIGS. 1 and 2, the contact elements 15 are shown on the opposite surface of the member's dielectric from the aforementioned additional circuitry needed to couple these elements to the designated circuitry (not shown) on member 21. Connections between elements 15 and the opposite circuitry on member 10 can be provided by plated-through-holes (PTH's) or similar means using technology known in the art.

Flexible circuit member 10, as shown in FIGS. 1 and 2, further includes a pair of locating elements 31 which, as understood, will be used to position member 10 within common circuit member 11 such that electrical contact may be achieved between the individual contact elements of member 10 and those of a respective one of the arrays 17 of contact elements 15' on member 11. Locating elements 31 are preferably stainless steel pins having a tapered end, these pins precisely oriented within holder 23 prior to positioning of substrate 13 thereon. Each pin has a diameter of about 1.5 mm and is cylindrical, projecting a distance of about 3.9 mm above the holder surface. Of further significance, the circuit pattern on flexible substrate 13 is produced utilizing highly precisioned, photolithographic techniques known in the art. Such techniques, as understood, enable the pattern of elements and/or circuit lines to be precisely located within a tolerance of about 0.025 mm. Importantly, a pair of holes 33 are precisely provided within the flexible substrate relative to the location of the array of contact pads, preferably simultaneously during the aforementioned photolithographic procedure. Such precision thus assures that these holes will be of precise dimensions and accurately located with respect to the contact pad array on flexible circuit 10. Such holes may be located and drilled after this procedure, as an alternative approach. With holes 33 and the contact elements and circuitry provided on the flexible substrate 13, the substrate is then positioned over pins 31 and subsequently clamped, using bars 27, onto holder 23. Connection between flexible circuit 13 and member 21 thus occurs.

The further assurance of precise alignment between the flexible circuit's array and pins 31 is made possible using a quantity of reinforcement material (e.g., copper) 37 (FIG. 2) located about each hole 33. This material is preferably copper, as stated, and deposited simultaneously with the placement of the circuitry and contact elements on substrate 13. Such utilization of reinforcement material enhances the retention of the flexible substrate on pins 31 by substantially preventing deformation (e.g., tearing) thereof as might occur during repeated use or mishandling. In one embodiment of the invention, the additional copper reinforcement material 37 preferably possesses a thickness of about 0.01 mm and surrounds the entire periphery of the respective hole 33 on the same surface as contact elements 15. In this example, the encircling portion possesses a width of only about 0.8 mm. It is understood that this copper reinforcement material is provided about both holes for each flexible circuit member 10 and may be on both sides of flexible circuit.

The subassembly as shown in FIGS. 1 and 2 is now ready for being positioned on the rigid, common circuit member 11.

In FIG. 3, there is shown a rigid, common circuit member 11 in accordance with a preferred embodiment of the invention. Circuit member 11 preferably comprises a circuitized substrate 39 of rectangular configuration and comprised of a known dielectric material having the shown plurality (e.g., seven or eight) of arrays 17 located thereon. A preferred dielectric material to assure the rigidity desired for substrate 39 is ceramic, several types of which are known in the art. Further description is not believed necessary. In one example of the invention, the ceramic substrate 39 possesses an overall width ("WC") of about 151 mm, a length (dimension "LC") of about 151 mm and a corresponding thickness of about 9 mm. The individual arrays 17 are preferably provided using known photolithographic techniques for such ceramic articles, and further description is not believed necessary. Such techniques are used in the manufacture of multilayered ceramic substrates, several types of which are known in the art. The ceramic substrate 39 is preferably frictionally fitted within a rectangular opening 41 provided within a support member 43. Accordingly, support member 43 and the ceramic substrate 39 comprise the invention's rigid, common circuit member. In a preferred embodiment, support member 43 is comprised of metallic material, a preferred material being stainless steel. Support 43 possesses an overall width of about 186 mm, a length of about 162 mm and a thickness of about 12 mm. As stated, the ceramic substrate may be frictionally fitted within the support's rectangular opening. This is not meant to limit the invention, however, in that other means for providing such secured positioning are possible, including the use of suitable adhesives, soldering, brazing or the like. Accordingly, a minor gap is shown between the internal surfaces of this rectangular opening and the external periphery of the ceramic member in FIG. 3 to accommodate such material, if desired. Such a gap would, of course, not be seen if the ceramic substrate were frictionally inserted. Most significantly, however, it is understood that the ceramic is fixedly positioned within the support and thus in fixed alignment relative thereto.

In accordance with the teachings herein, a precise method for accurately aligning a plurality of individual flexible circuit members such as member 10 with respect to the individual contact arrays 17 of common circuit member 11 is provided. With these two structures (flexible and common circuit members) individually assembled to the extent thus far described, such positioning can now occur. To accomplish this, a pair of reference points RP1 and RP2 (FIG. 3) are established on the peripheral support member 43. Preferably, these two reference points are established along the two, opposite longitudinal sides of support member 43 and parallel to bottom of edge B in the manner shown in FIG. 3. Points RP1 and RP2 are preferably spaced equidistant from the theoretical center line of the circuit arrays 17 such that the overall distance between both points is identical to the distance (dimension "WP") between located elements 31 (FIG. 1). These are then drilled and reamed at these locations. In one example, RP1 and RP2 may each possess a diameter of about 1.5 mm.

Once these two reference points are established, mathematical formulations (see further hereinbelow) are utilized to determine from these points a pair of location apertures for each contact array 17 so as to precisely locate each of the arrays on member 11 (and specifically, on substrate member 39 fixedly positioned relative to support member 43). This determination of such precise locations for each array 17 is preferably accomplished utilizing an optical measuring system, as typically used in the machining or printed circuit art.

With the array 17 locations now precisely determined, a pair of said location apertures (LA1 and LA2) are provided for each array, the first of these pairs (LA1) being provided along the same longitudinal side of support member 43 as first reference point RP1 and the second of these (LA2) provided along the opposite longitudinal side occupied also by the second original reference point RP2. The preferred method of providing each pair of location apertures LA1 and LA2 for each array 17 of contact elements is to use a drilling operation, the support member and retained substrate 39 being positioned within a fixture. Such drilling machines (a/k/a jigbore) are obtainable from American Corporation, New York, N.Y., under the product name/number SIP-620. Following the drilling of these location apertures, it is preferred to ream these apertures, using known reaming equipment. The apertures LA1, in one embodiment of the invention, possess a diameter of 1.52 mm, while those paired apertures LA2 possess a similar diameter but are also of elongated configuration (as shown in FIG. 3) for the purpose of tolerance compensation between locating elements 31 on member 10. It is understood that using the measurements obtained above, that each of the pair of location apertures LA1 and LA2 are precisely located on support member 43 relative to the respective arrays 17 located therebetween and that the exact locations for these apertures are also based on the nominal dimensions between the individual contact array locating elements 31 on the respective flexible circuit member being positioned on the respective array 17. That is, each of the location apertures is designed for receiving a pair of the described locating elements (pins) 31 to thus accurately orient the individual array of contact elements 15 from one of the flexible circuit members with a respective array 17 located between each pair of location apertures. Final contact is then simply accomplished by inserting these male pins within the provided location apertures. Once connection is achieved, some means (not shown) may be utilized to finally retain the flexible circuit member (e.g., the holder 23) against frame 43. Several means (e.g., clamps) may be utilized and further description is not believed necessary. It is understood that during flexible circuit member positioning, the bulbous portion of circuit 13 may be compressed and thus moved down pins 31. Significantly, such movement is permissible without adversely affecting the close tolerance dimensions between the pins and interim array of contact elements 15. In such an arrangement, an elastomer (not shown) may be used between the flexible circuit and holder's upper surface for the purpose of assuring uniformity of contact force (by compensating for vertical axis tolerances) at assembly.

Figure 4:
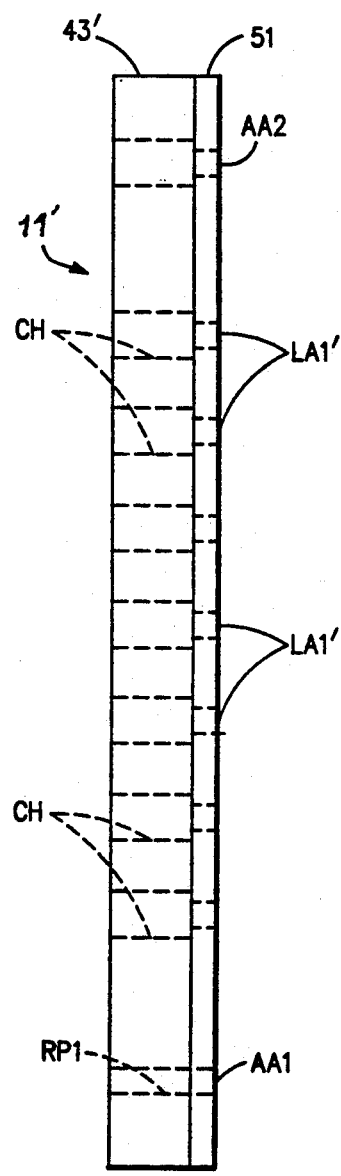
FIGS. 4 and 5 represent side and front elevational views, respectively, of a common circuit member and alignment members in accordance with another embodiment of the invention, the alignment members shown off to the sides of the common circuit member in FIG. 5 and thus prior to positioning thereon.
Figure 5:
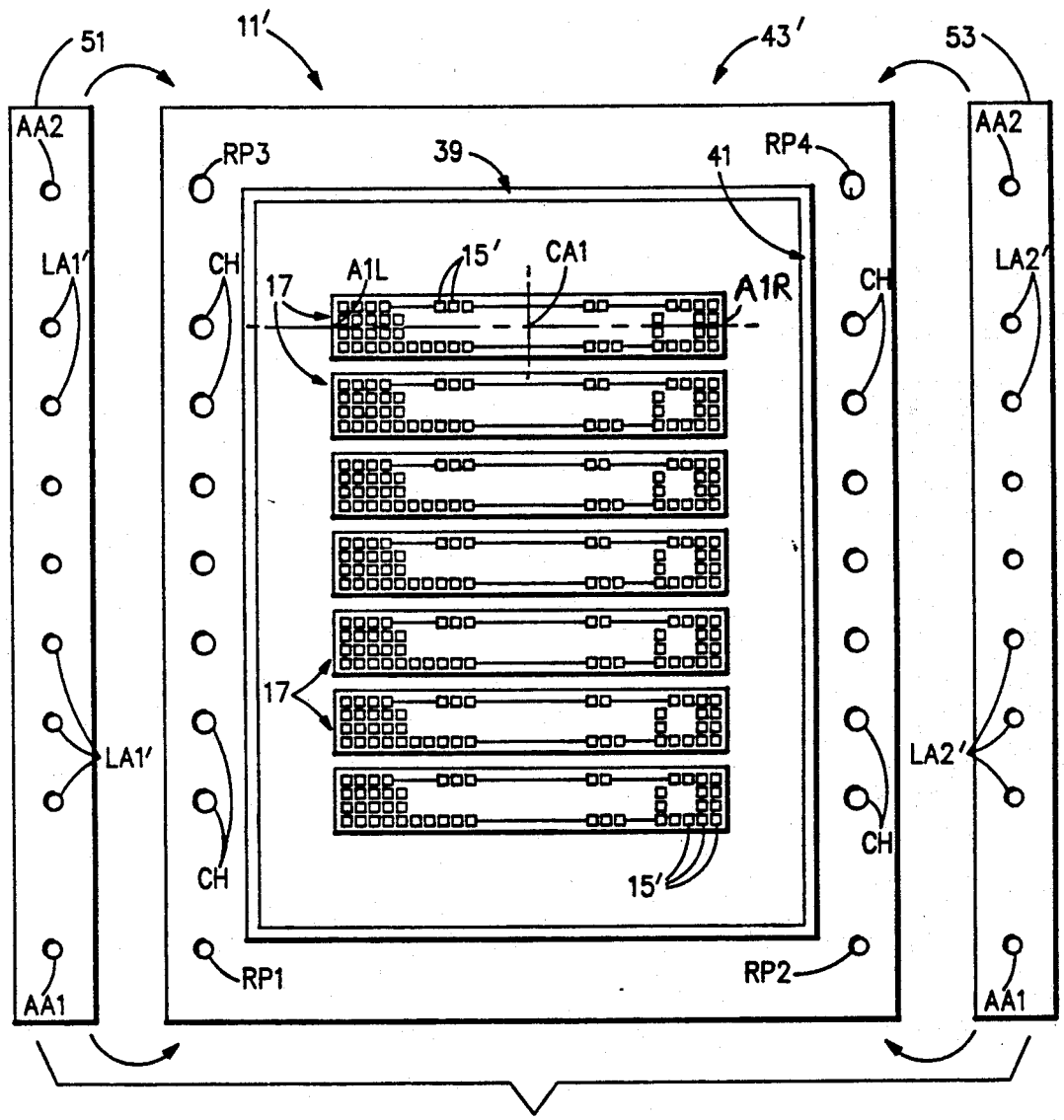

In accordance with another embodiment of the invention, there is shown in FIGS. 4 and 5 another method of accomplishing precise alignment and engagement between flexible circuit members 10 and a common circuit member 11. It is to be understood that the flexible circuit members adapted for being positioned on common circuit member 11 in FIG. 5 are preferably substantially identical to that flexible circuit member shown and described in FIGS. 1 and 2. Accordingly, the invention according to this additional embodiment is primarily directed to modified means for preparing the common circuit member. In FIG. 4, this common circuit member is referenced by the numeral 11' and includes, preferably, a ceramic substrate member 39 of substantially the same type described above. Substrate 39 is positioned within a rectangular opening 41 of a rectangular support member 43' having, preferably, identical overall width, length and thickness dimensions substantially similar to support member 43 in FIG. 3. The ceramic substrate member 39 is preferably retained within support member 43' in a similar manner (e.g., frictional fit, adhesives, etc.) as that of the substrate 39 in FIG. 3.

Although it is possible in accordance with the teachings herein that the rigid ceramic substrate 39 be provided within the surrounding support member 43' prior to providing of desired apertures (location and/or reference) within member 43', it is also uniquely possible, and perhaps even preferred, to provide the support member originally with at least the original reference points (and clearance) apertures described below. Further, the additional (location) apertures described below may also be provided in the original (open) version of this support member 43'.

In the embodiment of FIG. 5, first, second, third and fourth reference point apertures RP1, RP2, RP3 and RP4 are provided within the support member's longitudinal sides in the manner shown. With reference points RP1 and RP2 established (similarly to points RP1 and RP2 in FIG. 3), the precise location (x and y coordinates) of each rectangular array 17 is next determined, similarly to the determination of array 17 location in the embodiment of FIG. 3. RP3 and RP4 are also determined at this step. These are determined similarly to the steps used to define the locations of RP1 and RP2. Once these array and third and fourth reference point locations are established, mathematical calculations are performed to determine the precise location of the location apertures which, as understood, will be used to accept the locating elements of the individual flexible circuit members 10. For example, in FIG. 5, using RP1 as an origin (0,0) and defining the abscissa of the coordinate system (points RP1, RP2), the location of points A1L (array center left) and A1R (array center right) are determined. The array center (CA1) is determined as follows:

$$CA_x = \frac{(A1R_x - A1L_x)}{2} + A1L_x$$

and $$CA_y = \frac{(A1R_y - A1L_y)}{2} + A1L_y$$

Each array slope is determined by the equation:

$$\text{Slope} = \frac{A1R_y - A1L_y}{A1R_x - A1L_x}$$

Defining the slope array as an angle relative to the abscissa is achieved with the formula:

$$a = \tan^{-1}(\text{slope})$$

Using this information, the x, y positions for apertures LA1' and LA2' are determined. The following formulations are used:

LA1':

$$x \text{ dimension} = CA_x - \frac{WP}{2} \cos a$$

$$y \text{ dimension} = CA_y - \frac{WP}{2} \sin a$$

LA2':

$$x \text{ dimension} - CA_x - \frac{WP}{2} \cos a$$

$$y \text{ dimension} - CA_y - \frac{WP}{2} \sin a$$

At this stage, the end center points and center of one array relative to the coordinate system (RP1, RP2), in addition to the array's slope has been established. From this, the location apertures for said array have been precisely located. These steps are then repeated for each of the several arrays 17.

This information (drill data) is supplied to the aforementioned drilling machine, and the alignment members 51 and 53 (see below) drilled (AA1, AA2, LA1' and LA2' provided). Holes AA1 and AA2 will coincide with the reference points RP1, RP2 on support 43, when aligned thereover. These alignment apertures are of substantially identical dimensions (diameter) to those of the respective reference points on support member 43'. The diameter of apertures AA1, AA2, RP1, RP2 and the width of RP3 and RP4 are as nearly identical as possible; hence these apertures can be aligned during assembly by precision pins (AA1 to RP1, AA1 to RP2, AA2 to RP3 and AA2 to RP4, etc.).

The large arrows in FIG. 5 depict the fact that each member (51, 53) is to be located onto the respective longitudinal side adjacent same. (Phantom lines are also provided to represent the inner boundary of each member 51 and 53 once so positioned.)

In a preferred embodiment, each of the alignment members 51 and 53 is comprised of stainless steel and possesses an overall length substantially similar to the corresponding length of support member 43'. Additionally, each alignment member possesses a width of about 12 mm and a corresponding thickness of about 2 mm.

As shown in FIG. 5, clearance holes CH are also provided within the respective longitudinal sides of support member 43', these clearance holes being preferably of a diameter of about 6 mm and thus substantially larger than the overall outer diameter for the incoming cylindrical pins 31 (as well as the overlying, aligned location apertures formed within members 51 and 53). These clearance holes may be provided in the support member as originally provided (prior to positioning of substrate member 39 therein) as mentioned above. These clearance holes lie along the center lines between RP1 and RP3, and RP2 and RP4, respectively, at the nominal positions of the center lines of each array.

It is thus seen that precise positioning of the alignment members on support member 43' in the locations illustrated in FIG. 3 will result in the respective location apertures (LA1', LA2') on each alignment member being precisely located on the support member relative to the precisely determined locations so that these alignment members can accept the respective locating elements (pins) 31 and thus achieve precise positioning of the invention's several flexible circuit members on common circuit member 11'.

The use of separate alignment members 51 and 53 over the embodiment of FIG. 3 may be preferred because the rigid circuit member is not then subjected to shock, vibration, contamination or physical damage during the process of creating apertures LA1' and LA2'. Frame 43' serves to protect circuit member 39 once positioned therein (e.g., during assembly, handling, etc.). Use of separate alignment and frame members also allows for separate assembly operations (e.g., at different locations).

The assembled view of the embodiment shown in FIG. 5, as seen from the side to the left in FIG. 5, is shown in FIG. 4. Once so assembled, insertion of the locating elements of each flexible circuit member 10 may now occur.

Figure 6:
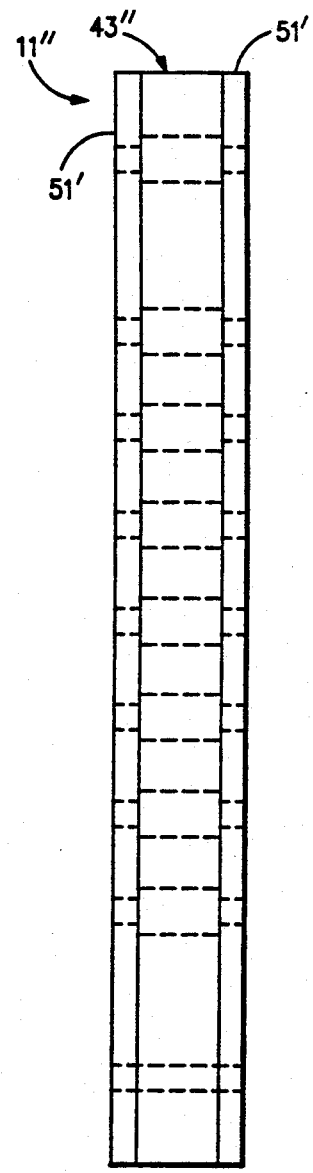
FIG. 6 illustrates a side elevational view of a common circuit member having two first and second alignment members thereon, in accordance with another embodiment of the invention.
Figure 7:
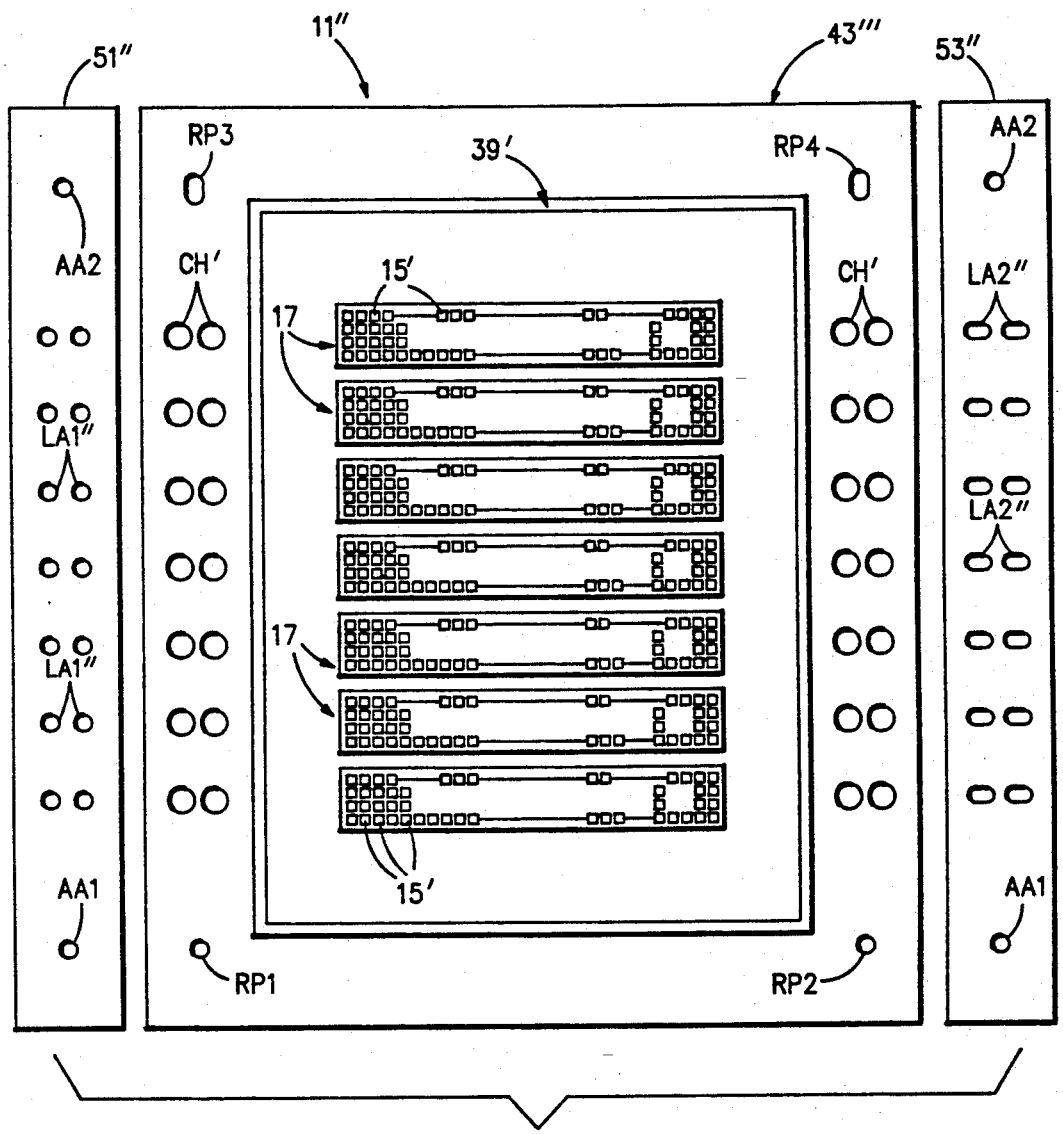
FIG. 7 illustrates a front elevational view of a common circuit member and adjacent alignment members in accordance with another embodiment of the invention.

In the two different embodiments of FIGS. 6 and 7, the common circuit members 43" (FIG. 6) and 43'" (FIG. 7) are each designed for accommodating a double-sided, rigid, common circuit member 39'. This common circuit member 39' is similar to that of the circuit member 39 shown in FIGS. 3 and 5, except that a second series of arrays 17 of contact pads are provided on the opposite side of this rigid member. In the embodiments depicted in FIG. 6 and 7, these opposite arrays (not shown) are intended to be exactly opposite those shown in FIG. 7 except for tolerance differences and possess similar overall dimensions to those shown. The embodiment in FIG. 6 shows alignment members 51' and 53' on both sides of circuit member 39'. The members 51' and 53' are assembled from both sides, and produced using the same procedures defined above for FIG. 3. In FIG. 6, it is understood that a pair of similar alignment members 51' is provided for each common support member 43", each of these alignment members for each such pair being positioned on an opposite side of the planar support. Member 51' thus each includes a singular column of apertures AA1, AA2, LA1' and LA2', as in members 51 and 53 in FIG. 5.

The embodiment of FIG. 7 thus is accomplished similarly to the method described in FIGS. 4 and 5, with the addition of added alignment apertures and location apertures within the alignment members 51" and 53" to be used therewith. Clearance holes CH are also provided, one set being provided for each respective linear pattern of location apertures LA1" or LA2", as desired. Further, alignment apertures AA1 and AA2 are also provided within the alignment members 51" and 53". These alignment members are also preferably of stainless steel and of similar dimensions to those shown in FIG. 5, with the exception that these members may be provided of additional width over their counterparts in FIG. 5 so as to better accommodate the illustrated paired apertures located therein. Similarly, the respective longitudinal sides of the support member 43'" have also been extended to accommodate the illustrated pairs of clearance holes in each side. It is understood that each linear pattern of clearance holes is designed to accommodate a respective linear pattern of location apertures located thereover when the respective alignment member is secured to support member 43'". In accordance with a preferred embodiment of the invention, each of the described alignment members is secured to the respective support member 43'" using dowel pins (not shown as previously described) which extend through both members and are clamped at the protruding end thereof or may be assembled with an adhesive known in the art. Alternatively, precision screws may be utilized. The alignment apertures, location apertures and clearance holes, as well as the reference points, are preferably provided within the support or alignment members using the aforementioned drilling equipment.

The embodiment of FIG. 7, when assembled and viewed from the left side, appears the same as FIG. 4.

Thus there has been shown and described a highly precise method of assembling a plurality of flexible circuit members onto a common circuit member of rigid construction to thus assure that the highly dense contact pad arrays for each flexible circuit will be accurately located with respect to the corresponding contact array to which it is to be connected. The method as defined herein can be accomplished using known equipment and can be carried out in a facile manner. Most significantly, the invention provides for tolerance compensation to overcome possible misalignment that may otherwise result from the several various operations used to manufacture the various elements described herein.

While there have been shown and described what are at present considered the preferred embodiments of the invention, it will be obvious to those skilled in the art that various changes and modifications may be made therein without departing from the scope of the invention as defined by the appended claims. By way of specific example, it is understood that although two separate alignment members are described herein, these two members may instead form part of an integral member which in turn may be aligned with and secured to the common frame member (e.g., 43') defined herein. The term alignment member as used herein is thus meant to include such an integral structure. Understandably, such a structure would preclude the requirement for the third and fourth reference points described herein.

What is claimed is:

1. A method of precisely positioning a plurality of flexible circuit members each having at least one contact array on a rigid, common circuit member having a plurality of contact arrays such that each of said contact arrays of said flexible circuit members aligns with and engages a respective one of said contact arrays of said rigid, common circuit member, said method comprising:

providing a plurality of flexible circuit members each including a flexible circuitized substrate having a contact array thereon and a holder member having at least two locating elements located at precise dimensions with respect to said contact array;

providing a rigid, common circuit member having a plurality of contact arrays;

establishing first and second reference points;

determining from said reference points the precise location of each of said contact arrays on said rigid, common circuit member;

determining the location of a pair of location apertures relative to each of said contact arrays on said rigid, common circuit member based on the dimensions between said two locating elements located at said precise dimensions with respect to each of said contact arrays of said flexible circuit members;

providing said pair of location apertures within said rigid, common circuit member relative to each said contact arrays on said rigid, common circuit member; and positioning said locating elements on each of said flexible circuit members within respective pairs of said location apertures to thereby align said contact arrays of said flexible circuit members to respective ones of said contact arrays of said rigid, common circuit member.

2. The method of claim 1 wherein said locating elements comprise pins and said flexible circuit members each include a pair of holes therein, said method further comprising positioning said pins within said holes prior to said positioning of said locating elements within said location apertures of said common circuit member.

3. The method of claim 1 further including providing a third circuit member relative to each of said flexible circuit members and electrically coupling each of said flexible circuit members to respective ones of said third circuit members.

4. The method of claim 3 further including positioning each of said third circuit members within said holder member of said respective flexible circuit member.

5. The method of claim 1 wherein said common circuit member comprises a circuitized substrate and a support member, said method further comprising positioning said circuitized substrate within said support member.

6. The method of claim 5 wherein said first and second reference points are established on said support member.

7. The method of claim 5 wherein said location apertures are provided within said support member.

8. The method of claim 7 wherein said location apertures are provided within said support member using a drilling operation.

9. A method of precisely positioning a plurality of flexible circuit members each having at least one contact array on a rigid, common circuit member having a plurality of contact arrays such that each of said contact arrays of said flexible circuit members aligns with and engages a respective one of said contact arrays of said rigid, common circuit member, said method comprising:

providing a plurality of flexible circuit members each including a flexible circuitized substrate having a contact array thereon and a holder member having at least two locating elements located at precise dimensions with respect to said contact array;

providing a rigid, common circuit member having a plurality of contact arrays;

establishing first and second reference points;

determining from said first and second reference points the precise location of each of said contact arrays on said rigid, common circuit member;

determining the location of a pair of location apertures relative to said common circuit member relative to each of said contact arrays of said common circuit member;

providing said pairs of location apertures relative to each of said contact arrays of said common rigid circuit member, including providing a first location aperture of each of said pairs of location apertures in a first alignment member and a second location aperture of each of said pairs of alignment apertures in a second alignment member;

positioning said first alignment member on said rigid, common circuit member relative to said first reference point;

positioning said second alignment member on said rigid, common circuit member relative to said second reference point; and positioning said locating elements of each of said flexible circuit members within respective pairs of said location apertures within said first and second alignment members to thereby align said contact arrays of said flexible circuit members to respective ones of said contact arrays of said rigid, common circuit members.

10. The method of claim 9 further including determining third and fourth reference points on said rigid, common circuit member prior to determining said location of said location apertures, said positioning of said first alignment member being relative to both said first and third reference points and said positioning of said second alignment member being relative to said second and fourth reference points.

11. The method of claim 9 wherein said locating elements comprise pins and said flexible circuit members each include a pair of holes therein, said method further comprising positioning said pins within said holes prior to said positioning of said locating elements within said location apertures of said first and second alignment members.

12. The method of claim 9 further including providing a third circuit member relative to each of said flexible circuit members and electrically coupling each of said flexible circuit members to respective ones of said third circuit members.

13. The method of claim 11 further including positioning each of said third circuit members within said holder member of said respective flexible circuit member.

14. The method of claim 10 wherein said common circuit member comprises a circuitized substrate and a support member, said method further comprising positioning said circuitized substrate within said support member.

15. The method of claim 14 wherein said first, second, third and fourth reference points are established on said support member.

16. The method of claim 15 wherein said location apertures are provided within said first and second alignment members using a drilling operation.

17. The method of claim 9 further including providing clearance openings within said common circuit member relative to selected ones of said location apertures within said first and second alignment members when said alignment members are positioned on said common circuit member.

18. The method of claim 16 wherein said clearance openings are provided within said common circuit member using a drilling operation.

* * * * *